United States Patent [19]

Pearcy et al.

[11] 4,347,552

[45] Aug. 31, 1982

[54] ASSEMBLY OF ELECTRICAL COMPONENTS WITH SUBSTRATES

[75] Inventors: Robert E. Pearcy; James E. Raus, both of Indianapolis, Ind.

[73] Assignee: Western Electric Company, Inc., New York, N.Y.

[21] Appl. No.: 140,263

[22] Filed: Apr. 14, 1980

[51] Int. Cl.³ .............................................. H05K 1/00
[52] U.S. Cl. ................................. 361/398; 339/17 C; 361/405
[58] Field of Search ...................... 29/837, 426.2, 854, 29/838, 839, 845; 174/68.5; 339/17 C; 228/215; 361/401, 404, 405

[56] References Cited

U.S. PATENT DOCUMENTS

| | | |
|---|---|---|
| 2,754,486 | 7/1956 | Hathorn . |
| 2,994,057 | 7/1961 | Donohue et al. ................. 29/854 X |
| 3,230,297 | 1/1966 | Means ............................ 228/215 X |
| 3,584,495 | 6/1971 | Rausina . |
| 3,747,045 | 7/1973 | Stross ............................... 339/17 C |
| 3,786,402 | 1/1974 | Horecky .......................... 339/17 C |
| 3,849,838 | 11/1974 | Hehl . |
| 3,880,486 | 4/1975 | Avakian ....................... 174/68.5 X |

FOREIGN PATENT DOCUMENTS

| | | |
|---|---|---|
| 1187694 | 2/1965 | Fed. Rep. of Germany . |
| 895321 | 5/1962 | United Kingdom ................. 29/837 |
| 968989 | 9/1964 | United Kingdom ............. 339/17 C |
| 1156806 | 7/1969 | United Kingdom ............. 339/17 C |
| 1224525 | 3/1971 | United Kingdom . |

Primary Examiner—Francis S. Husar
Assistant Examiner—C. J. Arbes
Attorney, Agent, or Firm—R. F. Kip, Jr.

[57] ABSTRACT

A lead (12) of an electrical component (10) is formed with an arrowhead-shaped tip (20) that functions to mechanically fasten the lead and component to a substrate (14), such as a flexible printed circuit (11). The tip is formed with barbs (21) extending rearwardly from the end (22) of the tip and having a width (W) across the barbs greater than the diameter (d) of a mounting hole (13) in the substrate. With this arrangement, the barbed tips may be inserted into and through the hole, with the barbs being compressed relatively inward with respect to the hole as the tip passes through the hole, so as to fasten the tips to the substrate in preparation for a soldering operation, in which the tips are soldered (30) to conductive pad areas (16) deposited on the surface of the substrate adjacent to the tips.

9 Claims, 5 Drawing Figures

ASSEMBLY OF ELECTRICAL COMPONENTS WITH SUBSTRATES

TECHNICAL FIELD

This application relates generally to techniques for attaching the leads of electrical components to substrates such as printed circuit boards, particularly flexible printed circuits, and specifically to certain barbed lead configurations and assembly methods for inserting the leads into mounting holes in the substrates so as to fasten the electrical component to the substrate in preparation for a soldering operation.

BACKGROUND OF THE INVENTION

In the past, various methods have been known to insert component leads through mounting holes in printed circuit substrates and to fasten the leads to the substrate in preparation for a lead-attaching operation, such as wave soldering. Probably the most common method used in the past, particularly with flexible printed circuits involving thin substrates of a flexible plastic material, has involved inserting straight, oversized leads downward into holes formed in the substrate, cutting or swaging the leads to length while holding the component body down against the substrate to fasten the lead and component in preparation for the soldering operation.

One object of the invention is to provide improved lead configurations, assemblies and methods wherein the leads tips are so formed that, when the lead tips are inserted through the substrate mounting holes, the tips automatically fasten and lock the component to the substrate in the desired position, thus eliminating the clipping, swaging and hold-down steps employed in the type of prior-art operation described in the preceding paragraph.

In addition, we are aware of two prior patents, Hathorn U.S. Pat. No. 2,754,486 and Rausina U.S. Pat. No. 3,584,495, both herein incorporated by reference, that disclose certain prior-art techniques wherein the leads are preformed with an arcuate crimped end section (Hathorn) or an outwardly bowed compression-fit section (Rausina, FIG. 8) so as to physically engage portions of a substrate in the vicinity of a mounting hole in order to temporarily fasten the component leads mechanically to the substrate for a soldering operation.

Further objects of the invention are to provide improved lead-tip configurations and methods of assembly for automatic fastening of the leads to the substrates, wherein the lead tips are positively locked to the substrate so that the components may be pulled out or accidentally dislodged from the substrate during the time interval between component assembly and the soldering operation.

Another object is to provide lead configurations and methods, wherein the lead tips are cammed inward or outward by the walls of the mounting holes during lead insertion, so as to automatically correct for any misalignment of the leads with the corresponding mounting holes.

A further object is to provide improved structures and methods wherein portions of the lead tip engage portions of the under surface of the substrate after lead insertion, so as to facilitate a wave soldering process of bonding the tips to adjacent contact pad areas deposited on the under surface of the substrate.

Another object is to provide improved techniques for inserting leads into through holes of flexible printed circuits having thin, flexible plastic substrates, which will provide a positive lock of the lead tip to the substrate, without damaging the substrate in the vicinity of the hole particularly with circuits involving conductive through holes.

SUMMARY OF THE INVENTION

With the foregoing and other objects in view, methods and structures in accordance with certain features of the invention involve forming an arrowhead-shaped tip at the end of a component lead, which tip is inserted into and through a mounting hole of a substrate such as a printed circuit board. The tip is formed with barbs extending rearwardly from the end of the tip and having a width across the barbs greater than the corresponding distance across the hole. With this arrangement, the barbed tips may be inserted into and through the mounting hole so as to mechanically fasten the lead and component to the substrate, with the barbs being compressed relatively inward with respect to the hole as the tip passes through the hole.

Preferably, the tip is formed from a malleable, conductive-metal lead by coining and stamping operations to form a flat, generally trapezoidal arrowhead-shaped tip, which also functions to cam the leads inward or outward during lead insertion, as required to correct for any misalignment between the leads and the holes. Preferably also, the lead length is set so that the barbs engage the under surface of the substrate after insertion, so as to facilitate a soldering operation in which the lead tips are soldered to contact pads deposited on the surface of the substrate adjacent to the tips. While these techniques are applicable to various types of printed circuits and component leads, they are especially useful in assembling a number of components with flexible printed circuits for a mass soldering operation, such as wave soldering.

Other objects, advantages and features of the invention will appear from the following detailed description of a specific embodiment thereof, when read in conjunction with the accompanying drawings.

DETAILED DESCRIPTION

Figure 1:
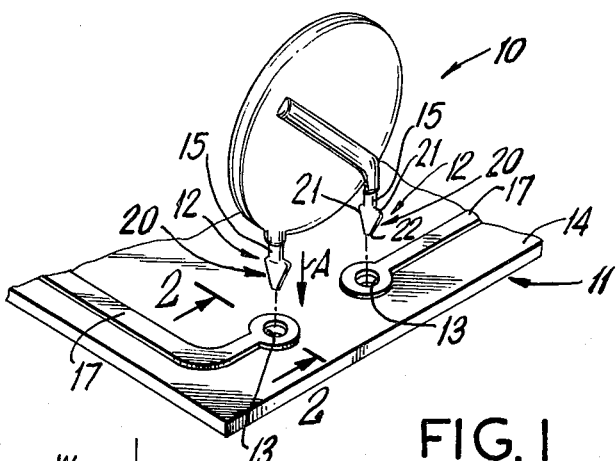
FIG. 1 is a fragmentary perspective view illustrating a portion of a printed circuit about to be assembled with an electrical component having barbed leads in accordance with one specific embodiment of this invention.
Figure 2:
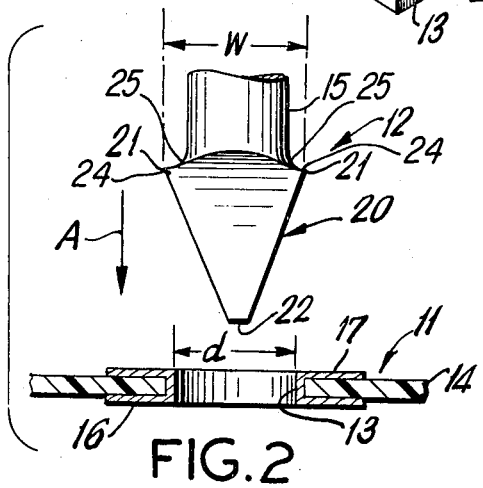
FIG. 2 is an enlarged vertical section along line 2—2 of FIG. 1, illustrating the parts prior to assembly, and with certain vertical dimensions exaggerated to illustrate principles.

Referring now in detail to the drawings, and particularly to FIGS. 1-2, there is illustrated a method of assembling an electrical component 10 with a printed circuit 11 in accordance with one specific embodiment of the invention. In this example, the component 10 is a thin disc-shaped varistor having a body portion and a pair of short, radial metallic leads 12—12 extending from the body portion that are to be inserted (arrow A) into a pair of corresponding, circular mounting or through holes 13—13 formed in a substrate 14 of the printed circuit 11, preparatory to soldering the leads 12 to printed circuit land areas or contact pads 16 (FIGS. 2-3) deposited along the under surface of the substrate, as viewed in FIGS. 1-4, adjacent to the through holes 13. In this example, the circuit 11 is a "flexible" printed circuit including a thin substrate 14 of a flexible plastic material, such as an eight mil (2 mm) "epoxy-Dacron*" film mat, a polyester-polyamid film impregnated with a flame retardant epoxy resin, having patterns of printed circuit conductors 17 deposited on one or usually both sides of the substrate 14 in any conventional fashion. Other plastics commonly used in flexible circuits are Mylar* films and Kapton* films.

*Registered Trademarks of E. I. duPont deNemours and Co.

In the example illustrated, the circuit 11 is a conventional two-sided printed circuit having a first pattern of conductors 17 deposited on the upper surface, as viewed in FIG. 1, and a second pattern of conductors on the under surface including contact pads 16 deposited on the under surface adjacent to the through holes 13 wherever connections are to be made between the printed circuit conductors and component leads such as 12. Wherever connections are desired between printed circuits such as 17 on the upper surface and circuits on the reverse, the holes 13 are plated with conductive material as illustrated, so as to form "conductive through holes" 13 connecting portions of the circuit 16 on the bottom surface of the substrate to portions of the circuit 17 on the top surface, as is well known in the art.

The principal purpose of the present invention is to provide improved methods and component lead configurations for lead-insertion operations that assemble components such as 10 with printed circuits 11 so as to mechanically fasten the leads 12 and components 10 to the substrate 14 in preparation for a soldering operation such as wave soldering, in which the leads 12 are soldered to the pads 16 to connect the leads mechanically and electrically to the desired portions of the printed circuit 11. In accordance with the present invention, the leads 12 are cylindrical so as to each have a cylindrical shank portion 15 extending from the body portion of component 10 into a respective hole 13 and at least partway through such hole. As shown (FIGS. 3 and 4), each such shank portion fits in the hole into which it is inserted with a radial clearance less than the radius of the shank portion. The shank portions 15 are joined to ends of the leads 12 which are are formed with arrowhead-shaped tips 20, as illustrated, having backward facing barbs 21—21 rearward of the end or point 22 of the tip each barb 21 having respective outer points 24 and respective backward facing surfaces 25 extending from such points to the lead's shank portion 15 at a moderate inclination (FIG. 3) to the undersurface of the substrate 14. Each tip 20 is adapted to be inserted (arrow "A") into and through the corresponding mounting hole 13 so as to mechanically fasten the lead and component to the substrate 14 as illustrated in FIGS. 3-4, in preparation for the soldering operation.

Figure 3:
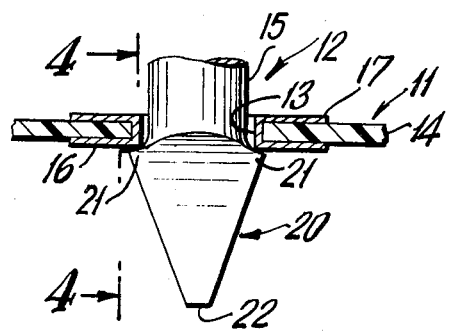
FIG. 3 is a view similar to FIG. 2, illustrating the parts after preliminary assembly.

The tip 20 is dimensioned so that the width W between the points 24 of the barbs 21—21 at the top thereof is slightly greater than the corresponding distance (diameter) d across the hole 13, so that the barbs 21 are compressed relatively inward with respect to the hole as the tip 20 passes through the hole from the position of FIG. 2 to that of FIG. 3, the amount by which W exceeds d being small enough that the tip may be manually forced forwardly through the hole. After the barbs 21 have cleared the hole 13, they return or spring back partially toward their original positions, depending on the nature of the particular lead material used, so as mechanically fasten or lock the leads 12—12 to the substrate 14 as shown in FIGS. 3-4.

In a typical example, using conventional tinned copper leads and a flattened, generally trapezoidal arrowhead 20 configuration as illustrated, the width W across the barbs may be set at 0.035 to 0.037 inches (0.89 to 0.94 mm) for use with a hole diameter d of 0.032 mils (0.81 mm) in flexible printed circuits 11 of the type described above. Obviously, many variations in barb configuration may be made based on the sizes and dimensions of the leads and printed circuit substrates, the materials involved, and the type of insertion operation. In general, the degree of the interference fit (W-d) is set so that the barbs 21 may be inserted into and through the hole 13, as described above, with a desired insertion force, such as finger pressure in a typical example, while reverting sufficiently toward their initial positions after compression as to lock the tips 20 to the substrate 14 as described. After insertion, the barbs prevent the component 10 from being removed or accidentally dislodged from the substrate 14 and thus retain the component in the inserted position assembled with the substrate, indefinitely, and until after the soldering operation which attaches and bonds the leads permanently to the adjacent portions of the printed circuit. That is, the amount by which the width W between the barb points 24 of each tip exceeds the corresponding distance d across the hole is large enough so that, taken together with the moderate inclination of the backward facing surfaces 25 of the barb (such inclination being small enough to prevent such surfaces from having any significant wedging effect on the side of the hole), there will result a positive locking of the barbs with the substrate against retraction of the lead from the hole.

Figure 4:
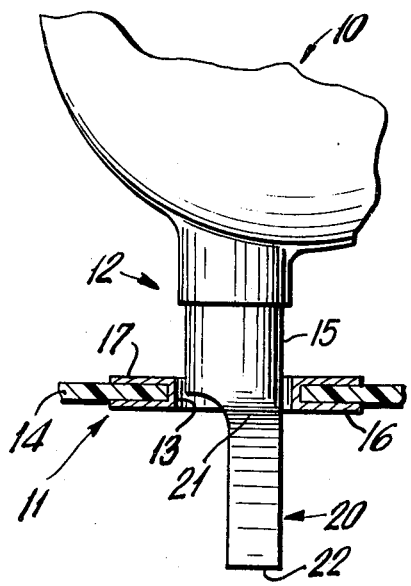
FIG. 4 is a side sectional view of the assembly of FIG 3, taken along line 4—4 of FIG. 3.

Preferably, the length of the leads 12 is set so that the body of the component 10 rests against the upper surface of the substrate 14 after the leads have been inserted and the outer or upper surfaces of the barbs 21—21 make physical contact with the under surface of the substrate as illustrated in FIGS. 3-4. As noted above, the final joint between lead 12 and contact pad 16 is made in the soldering operation. Thus, it is sufficient where desired for the arrowhead tips 20 to mechanically fasten the component 10 only loosely to the substrate 14 in the lead-inserting operation. The leads 12 may either be preformed to the desired length, or are cut to length where necessary in a preliminary operation prior to formation of the barbed tip 20.

The barbed tip 20 may be fabricated by conventional metal-forming techniques, preferably by first coining the end of the lead and then stamping to form the desired arrowhead configuration. Typically, the leads 12 are cylindrical leads made of a conductive, relatively malleable metal such as solder plated copper smaller in diameter than the diameter of the hole, which can readily be coined and stamped to form to the desired tip configuration. In a typical example, using cylindrical tinned copper leads 12 having a diameter of 0.025 inches (0.64 mm), the ends are first coined to form a flattened, generally round configuration having the overall desired length and width for the tip 20, and then are stamped to form the flat, generally trapezoidal shape illustrated in FIGS. 3-4.

In a typical example as described above, the leads 12 are inserted manually into the mounting holes 13 of the substrate 14 to assemble a number of the components 10 with a single printed circuit 11. Also, it should be noted that the arrowhead tips 20 are self-aligning in that, if one or both tips 20 is slightly misaligned with the corresponding hole 13, the walls of the hole 13 will cam the tip slightly inward or outward as required as the tip passes through the hole, so as to precisely center the leads 12 with respect to the holes 13.

After all of the components 10 have been assembled with the substrate 14 as described above, the lead tips 20 are mechanically and electrically connected to the contact pads 16 in any known fashion, preferably by a conventional wave-soldering process in which a fountain of liquid solder impinges on the under surface of the substrate 14 to form solder joints 30 (FIG. 5) mechanically and electrically connecting the tips 20 to the pads 16 and filling the spaces between the tip 20 and the pads 16, as is well known in the art.

While the specific example described above relates to the assembly of radially leaded components having cylindrical copper leads with two-sided flexible printed circuits having conductive through holes, it should be apparent that the assembly techniques are readily applicable to other types of components and printed circuits. For example, while these assembly techniques are particularly useful to assemble components with flexible printed circuits of the type described above, they may also be used with "rigid" printed circuit boards or cards, such as those having relatively rigid thermoplastic or thermosetting substrates, or epoxy coated metal boards, or ceramic substrates, etc. Where axially leaded components, such as resistors, are involved, the leads are clipped to length if necessary and then bent 90° prior to insertion (for example, as generally illustrated in the Hathorn patent or the Rausina patent cited previously) and prior to formation of barbed tips as described in this application. While the process is particularly useful in combination with wave soldering operations as described above, other types of lead-bonding may be used, such as hand soldering. In the case of hand soldering, this method holds the parts in place while the substrate is turned over for the hand-soldering operation.

While the Hathorn and Rausina patents disclose two prior-known methods of physically assembling component leads with substrates for a lead-bonding operation, perhaps the most common lead-attach method used in industry today for the types of circuits illustrated in this application involves inserting straight, oversized leads into through holes such as 13, clipping the leads to length beneath the substrate, clenching or crimping the ends of the leads against the bottom surface of the substrate 14 to make a mechanical connection, and thereafter wave soldering the under surface of the substrate to form the desired electrical connections between the ends of the leads and the contact pads such as 16. In this type of process, the components 10 must be physically held down against the board surface while the trimming and crimping operations take place, prior to the wave soldering operation.

With respect to various other prior-known methods of assembling leads with substrates, such as the methods disclosed in the Hathorn and Rausina patents, the techniques described in this application have the advantage of forming a positive lock between the barbed tips 20 and the substrate 14, as described above, so that the components 10 may not be easily pulled out or accidentally dislodged from the substrate during the frequently extensive time interval between component insertion and soldering, which often takes place much later at a different work position. In many cases, a large number of components are assembled with the substrate, one at a time, preparatory to a mass soldering operation in which many leads are soldered to the associated pads 16 at the same time.

In addition, the leads 12 and tips 20 can readily be formed in length and width (W) across the barbs 21—21 so that the barbs 21—21 engage the under surface of the substrate 14 after lead insertion, to provide a positive mechanical lock between lead and substrate, which is of particular importance in connection with thin, flexible substrates, and wherein other forms of lead attach operation are less well adapted. Also, the automatic centering feature discussed above, wherein the angled side walls of the arrowhead tips are cammed inward or outward by the walls of the holes 13, as required, during the lead insertion step to automatically align the leads with the holes, is of significant interest particularly in assembling large numbers of components with a single substrate.

The invention is particularly advantageous with thin flexible plastic substrates as described above in that the arrowhead shaped tips 20 may easily be inserted through the relatively small holes 13 (such as 32 mil holes) in the thin flexible plastic substrate without damaging the substrate, as described above, while providing a positive lock between leads and substrate.

Another important feature is that, in cases where the lead height above the printed circuit board 11 is critical, the formation of arrowhead tips 20 in accordance with this invention eliminates subsequent or post lead-length clipping operations.

Figure 5:
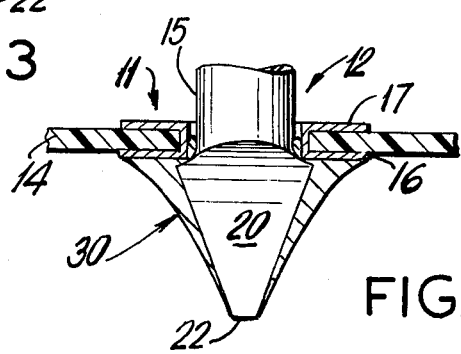
FIG. 5 is a view similar to FIG. 3, after a wave-soldering operation.

Further, the enlarged arrowhead tip located beneath the substrate and preferably in contact therewith, and having barbs 21—21 extending outward beyond the diameter of the hole 13 as illustrated in FIG. 3, provides a more extensive base for the molten solder to adhere to in bonding the tips 20 to the pads 16 and filling in the spaces between tip and pad 16 as depicted in FIG. 5.

While one specific embodiment of the invention has been described in detail herein, it should be apparent that various modifications may be made from the specific details described, as discussed in part in the preceding paragraphs, and that numerous variations may be made in the details of lead and printed circuit configurations, geometry and materials to suit specific applications, without departing from the principles and scope of the invention.

What is claimed is:
1. An assembly comprising:
 (a) a substrate having a mounting hole threthrough; and
 (b) an electrical component mounted on the substrate; the component having a body portion and at least one lead of malleable conductive metal having a cylindrical shank portion extending from the body portion into and at least partway through the hole with a radial clearance from the wall of the hole less than the radius of such shank portion, the lead moreover having an arrowhead-shaped tip formed at the end thereof and integrally joined to said shank portion and positioned on the opposite side of the substrate from the component body for me- chanically fastening the lead and component to the substrate, such tip being constituted of solid metal over the full extent of the dimensions occupied by such tip, the tip having barbs disposed rearward of the end of the tip, said barbs being characterized by respective backward facing points at the transversely outer extremities of said tip, and by respective surfaces extending from such points to said shank portion so as to be engageable with said opposite side of said substrate without a significant wedging effect on the side of said hole, the width between the points of such barbs being greater than the corresponding distance across the hole by an amount which is small enough to permit said tip to have been manually forced forward through said hole but which is large enough to produce a positive lock between such barbs and such substrate.

2. An assembly as recited in claim 1, wherein the tip comprises a flat, generally trapezoidal, arrow-shaped member.

3. An assembly as recited in claim 1, wherein the length of the lead is set so that the outer surfaces of the barbs contact the adjacent surfaces of the substrate on the opposite side from the component body after the tip has been inserted through the hole.

4. An assembly as recited in claim 3, wherein the length of the lead is further set so that the body of the component contacts the surface of the substrate on the side opposite from the tip.

5. An assembly as recited in any of claims 1, 2, 3 and 4, wherein the substrate is a printed circuit substrate having a circular mounting hole and having a contact pad deposited adjacent to the mounting hole on the surface of the substrate adjacent to the tip.

6. An assembly as recited in claim 5, wherein the printed circuit is a flexible printed circuit.

7. An assembly as recited in claim 5, further comprising a solder joint mechanically and electrically connecting the tip to the contact pad.

8. An assembly as recited in claim 7, wherein the solder joint comprises a wave-soldered joint.

9. An assembly as recited in claim 8, wherein the printed circuit is a flexible printed circuit having a plurality of components mounted thereon and having barbed leads soldered to a plurality of associated contact pads.

* * * * *